United States Patent
Plies et al.

(10) Patent No.: US 6,580,073 B2
(45) Date of Patent: Jun. 17, 2003

(54) MONOCHROMATOR FOR CHARGED PARTICLES

(75) Inventors: Erich Plies, Tübingen (DE); Jan Bärtle, Tübingen (DE); Armin Huber, Reutlingen (DE)

(73) Assignee: Leo Elektronenmikros Kopie GmbH, Oberkochen (DE)

( * ) Notice: Subject to any disclaimer, the term of this patent is extended or adjusted under 35 U.S.C. 154(b) by 0 days.

(21) Appl. No.: 10/012,512

(22) Filed: Dec. 12, 2001

(65) Prior Publication Data

US 2002/0104966 A1 Aug. 8, 2002

(30) Foreign Application Priority Data

Dec. 12, 2000 (DE) .......................................... 100 61 798

(51) Int. Cl.[7] .............................................. H01J 47/00
(52) U.S. Cl. ...................................... 250/305; 250/311
(58) Field of Search .................................. 250/305, 311

(56) References Cited

U.S. PATENT DOCUMENTS

| | | | | |
|---|---|---|---|---|
| 5,097,126 A | * | 3/1992 | Krivanek | ..................... 250/305 |
| 5,126,565 A | * | 6/1992 | Rose | ........................... 250/305 |
| 6,111,253 A | * | 8/2000 | Tsuno | .......................... 250/311 |

OTHER PUBLICATIONS

W. Wein, Ann. Phys. 65 (1898), p. 444.*
Tanaka et al. Institute of Physics Conference Series No. 165, Symposium 6, pp. 217 and 218.*
Tanaka et al. Institute of Physics Conference Series No. 165, Symposium 6, pp. 211 and 212.*
"Journal of Physics E: Scientific Instruments", vol. 3 (1970) p. 121.*

* cited by examiner

Primary Examiner—John R. Lee
Assistant Examiner—Erin-Michael Gill
(74) Attorney, Agent, or Firm—Walter Ottesen

(57) ABSTRACT

The invention relates to a monochromator on the basis of Wien filters. According to a first aspect, four Wien filters are arranged in series along a common optical axis of which the two center Wien filters are each rotated by 90° relative to the two outer Wien filters. The two center Wien filters (W2, W3) are orientated simultaneously anti-parallel to each other. Such a monochromator has inherent stigmatic imaging characteristics and is, as a unit, free of dispersion. According to a further aspect, each of the Wien filters is configured symmetrically with reference to a 90° rotation about the optical axis. The magnetic and the electrostatic poles of the Wien filter are identically dimensioned so that the orientation of the Wien filter azimuthally about the optical axis (OA) can be varied by a corresponding drive of the particular contacts for the voltage supply and current supply of the electrodes and coils.

13 Claims, 3 Drawing Sheets

MONOCHROMATOR FOR CHARGED PARTICLES

BACKGROUND OF THE INVENTION

In modern low voltage electron microscopes, especially the chromatic unsharpness, and especially the axial chromatic aberration of the first order, limits the achievable resolution to approximately 3 nm for 1 keV electron energy. The diameter d of the disc of the chromatic aberration in the Gaussian image plane of an objective can be described as a product of the chromatic aberration constant CF, the aperture α of the electron beam in the Gaussian image plane and the relative energy width δE/E of the electron beam.

In the utilized rotation-symmetrical electron lenses, the chromatic aberration constant is in principle unequal to zero because of the Scherzer theorem and the electrons are not monochromatic because of the emission process and the Boersch effect, that is, the anomalous broadening of the energy distribution because of stochastic Coulomb interaction so that the relative energy bandwidth is always unequal to zero. The chromatic aberration constant is approximately 1.5 mm for electrons having an energy of 1keV and for a working distance of 2 mm in modern low voltage scanning electron microscopes having an optimized objective lens and a zirconium oxide-tungsten-Schottky emitter as an electron source. The energy width δE amounts to approximately 0.5 to 1 eV in dependence upon the beam current.

A further minimization of the chromatic aberration constant is hardly possible. For this reason, it is already known, in order to further increase the resolution, to utilize chromatic aberration correctors which comprise either quadrupole lens systems or electrostatic mirrors. Chromatic aberration correctors are as a rule very complex with respect to their configuration and, as an alternative thereto, the energy width of the electron beam, which is processed subsequently by the downstream electron-optical imaging system, can be reduced with the aid of a monochromator.

Rotationally symmetrical electrostatic filter lenses are known as monochromators having a relatively simple configuration. In these filter lenses, those particles are filtered out whose kinetic energy lies below the energy defined by the electrostatic potential difference. These particles are filtered out by an electrostatic field directed in opposition to the propagation direction of the particles. Such electrostatic filter lenses have, however, the disadvantage that the beam brightness of the electron beam can be greatly deteriorated.

Furthermore, Wien filters are known as monochromators for charged particles wherein an electrostatic dipole field and a magnetic dipole field are superposed perpendicularly to each other. From the article in the "Journal of Physics E: Scientific Instruments", Volume 3 (1970), starting at page 121, it is already known to seat two Wien filters arranged one behind the other. The transmitted specimen is mounted between the two Wien filters. The second Wien filter functions as an energy analyzer to generate the electron energy loss spectrum of the specimen. The Wien filters are arranged between two quadrupole lenses in order to compensate the focusing action of the Wien filters in one direction, namely, in the direction of the electrostatic field.

In a more recent conference contribution by Tanaka et al (published in the Institute of Physics Conferences Series No. 165, Symposium 6, pages 217 and 218), a further monochromator is suggested which comprises two Wien filters arranged one behind the other. The energy selection takes place in the center between the two Wien filters. The second Wien filter functions to compensate the astigmatic imaging generated by the first Wien filter.

In a further conference contribution by Terauchi and Tanaka (published in the same volume, pages 211 and 212), a configuration of a Wien filter is described wherein the surfaces of the electrostatic electrodes as well as the surfaces of the pole shoes of the magnetic dipole are configured as cylindrical surfaces so that maintaining the Wien condition is ensured also in the fringing field regions and to produce stigmatic imaging.

It is an object of the invention to provide a monochromator having a simple configuration which is simple to adjust and has no disadvantageous influence on the beam brightness of the filtered particle beam.

The monochromator of the invention is for charged particles having a direction of propagation. The monochromator includes: a plurality of Wien filters defining an optical axis and being arranged serially one behind the other in the direction of propagation; and, a first portion of the Wien filters being mounted azimuthally rotated about the optical axis by 90° relative to a second portion of the Wien filters.

According to a first aspect of the invention, the monochromator preferably exhibits four Wien filters arranged in series one behind the other of which one portion is rotated azimuthally by 90° about the optical axis relative to the other Wien filters. With this mutually opposed rotated arrangement of the Wien filters, it is achieved that a portion of the Wien filters, preferably the two outer Wien filters, generate an astigmatic imaging in one direction and the other Wien filters (preferably, the center Wien filters) generate an astigmatic imaging in the direction perpendicular thereto so that, in total, a stigmatic imaging is achieved. According to a first aspect of the invention, the monochromator itself can image stigmatically. For this reason, no further elements, especially no additional quadrupoles, are needed for a stigmatic imaging.

The fields in the outer Wien filters should be aligned parallel to each other and the fields in the center Wien filters should be directed antiparallel to each other. Additionally, the refractive forces of the individual Wien filters should be so selected that one of the two axial fundamental paths of the monochromator is symmetrical to the center plane of the monochromator and the axial fundamental path in the intersect plane perpendicular thereto is antisymmetric to the center plane of the monochromator. In this way, it is achieved that the imaging, which is generated by the monochromator, in total is also dispersion-free. Energy fluctuations then lead to no time-dependent movement of the image.

An astigmatic intermediate image is generated in the center plane of the monochromator whereat the energy filtering can take place by a slit diaphragm.

The refractive power of the outer Wien filters should be selected greater than the refractive power of the inner Wien filters in order to generate stigmatic imaging.

According to a second aspect of the invention, with one or several Wien filters arranged one behind the other in the propagation direction, the pole shoes of the magnetic dipole(s) of the Wien filter(s) and the electrodes of the electric dipole(s) of the Wien filter(s) are configured symmetrically to each other with respect to an azimuth rotation by 90° about the common optical axis. For this purpose, the electrodes of the electric dipoles should be made of the same soft magnetic material as the pole shoes of the magnetic dipoles. Because of the symmetrical configuration of the magnetic dipoles and the electric dipoles to each other, it is achieved that the magnetic and electrostatic potential distribution and also the magnetic and electrostatic field distribution are the same in each longitudinal direction as well as in each transverse direction.

The symmetry of the magnetic and electrostatic dipole fields also in the fringing field regions leads, on the one hand, to the situation that the imaging errors are avoided. Simultaneously, the symmetrical configuration of the electrostatic portion and of the magnetic portion of the individual Wien filters affords manufacturing advantages in the serial arrangement of several Wien filters rotated relative to each other. The electrodes and pole shoe parts of all Wien filters to be combined with each other can be manufactured from one material block which, in a first processing step, is provided with a central longitudinal bore for the passage of the electron path and further longitudinal bores for the later reassembling.

Only in a second step, the electrodes and the pole shoes of all Wien filters, which are to be combined with each other, are machined out and, only in a third step, the block of material is taken apart perpendicularly to the bores generated in a first step. In a subsequent step, the coils and the electric contacts are applied and the insulation is applied between the individual pole shoes. With the aid of the assembly bores generated in the first step, it is ensured in a later reassembly that the arrangement is mutually symmetrical.

For a correct adjustment of the Wien condition also in the fringing field regions of the Wien filters, the surfaces of the pole shoes, which are directed to each other, and the electrodes should be configured as concentric spherical surface sections or coaxial cylinder surface sections. The concentric spherical surface sections or the coaxial cylinder surface sections of the surfaces of the pole shoes and electrodes directed to each other can, however, also be approximated by a plurality of polygonally arranged surfaces which are planar. Furthermore, the individual pole shoes of each Wien filter should be electrically insulated with respect to each other and diaphragms made of a material of high magnetic permeability should be arranged between the individual Wien filters in order to prevent cross talking of the magnetic fields between the Wien filters.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
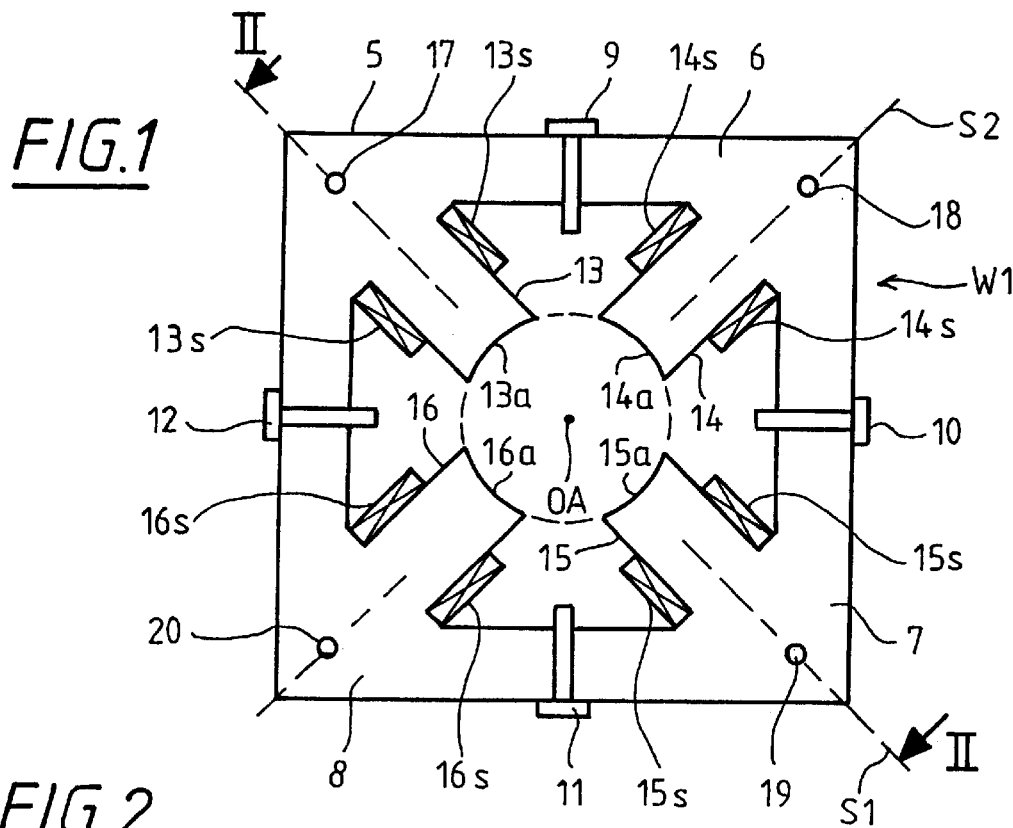
FIG. 1 shows a section through a monochromator of the invention in a plane perpendicular to the optical axis.
Figure 2:
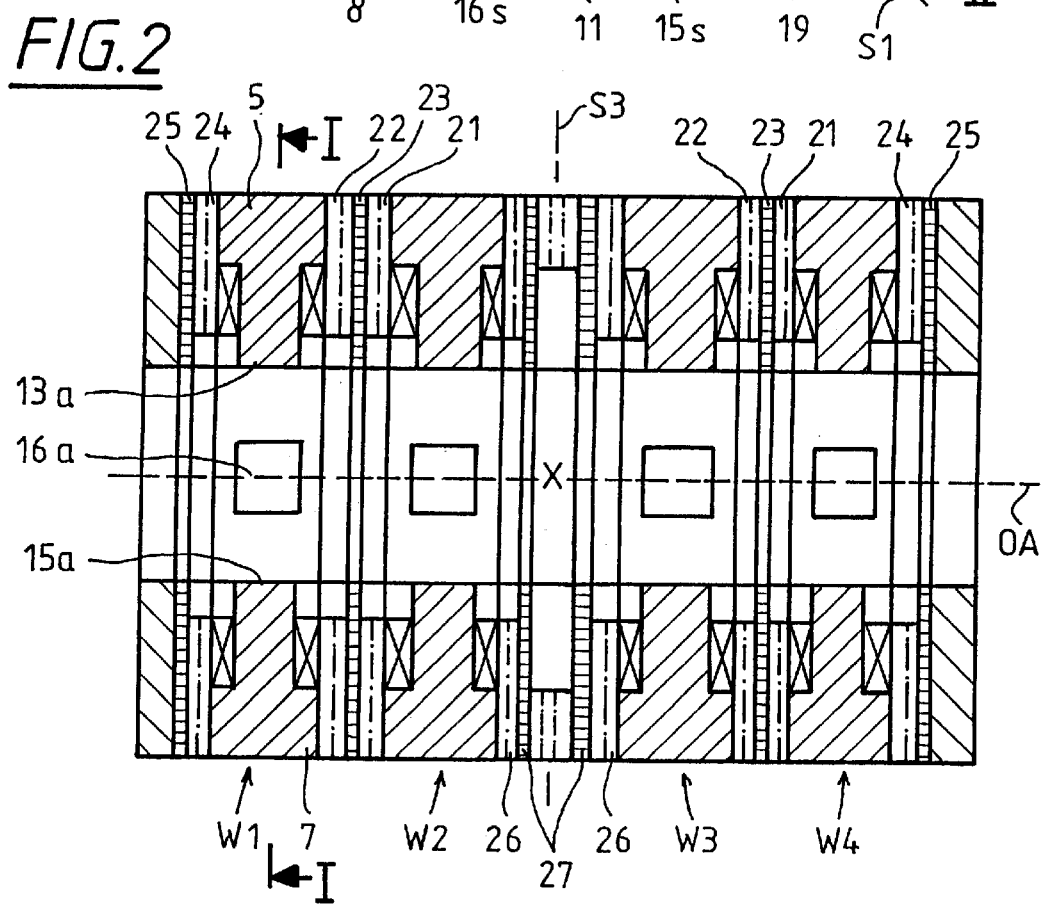
FIG. 2 shows a section taken through the monochromator of FIG. 1 along the cutting plane II—II.

As shown in FIGS. 1 and 2, the monochromator of the invention includes a total of four Wien filters (W1, W2, W3, W4), which are arranged serially along a common optical axis OA. Each of the Wien filters is configured symmetrically with reference to a rotation of 90° about the optical axis OA; that is, each of the Wien filters (W1, W2, W3, W4) is symmetrical with respect to two mutually perpendicular planes (S1, S2). Each of the Wien filters comprises four pole shoe segments (5, 6, 7, 8) which are electrically insulated with respect to each other by insulators (9, 10, 11, 12). Each of the four pole shoe segments (5, 6, 7, 8) has a pole shoe (13, 14, 15, 16) running in the direction of the optical axis OA. The end surfaces (13a, 14a, 15a, 16a) of all four pole shoes face toward the optical axis OA. These end surfaces are configured as cylindrical surface sections coaxial to the optical axis OA. Magnetic coils (13s, 14s, 15s, 16s) are placed about corresponding ones of the pole shoes (13, 14, 15, 16) for generating the magnetic dipole fields.

At this point, it is noted that the entire assembly of each individual Wien filter is similar to the configuration of a magnetic quadrupole because of the 90° symmetry with respect to a rotation about the optical axis OA. In contrast to a magnetic quadrupole, however, the Wien filters in a monochromator of the invention generate no quadrupole fields but instead generate pure dipole fields. Accordingly, the respective coils (13s, 15s) and (14s, 16s) of opposite-lying pole shoes (13, 15) and (14, 16), respectively, are energized opposite to each other so that the opposite-lying pole shoe end surfaces (13a, 15a) and (14a, 16a) form the magnetic North and South poles. If the Wien filter is so operated that, for example, the two opposite-lying pole shoes (13, 15) form the magnetic North and South poles, then the two pole shoes (14, 16), which are rotated thereto by 90°, form the electrodes for the electric dipoles. For this purpose, the pole shoe segments (6, 8), with which these two pole shoes (14, 16) are connected, are charged with suitable electric potentials via contacts not shown in detail. The pole shoes (14, 16) form the electrodes. The coils (14s, 16s), which are placed about those pole shoes (14, 16), which form the electrodes of the electrostatic dipole, are actually not needed in this mode of operation. However, they afford the possibility to operate the Wien filter rotated by 90° with respect to the optical axis OA so that all four Wien filters (W1, W2, W3, W4) can have an identical configuration and are only differently driven with respect to the electric and magnetic contacts.

In FIG. 1, bores (17, 18, 19, 20) are shown which are provided for a centered assembly of the serial arrangement of several Wien filters.

As shown in FIG. 2, the four Wien filters (W1, W2, W3, W4) are arranged in the direction of the optical axis with respect to their mechanical assembly symmetrically to the center plane S3. Each two mutually adjacent ones of the Wien filters (W1, W2), (W3, W4) are delimited with respect to each other by a set containing an electric insulator 21, an electrically conductive shielding plate 23 and a further insulator 22. The shielding plates 23 prevent a crosstalk of the magnetic dipole fields as well as a crosstalk of the electrostatic dipole fields from one Wien filter to the next adjacent Wien filter. The electric insulators (21, 22) prevent short circuits. The shielding plates 23 accordingly form fringing field diaphragms and comprise an electrically conductive soft magnetic material, that is, a ferromagnetic material having high permeability, high conductivity and low remanence. The permeability should be greater than 10,000. Suitable materials are materials provided, for example, by the Vacuumschmelze Company under the product designation "Mumetal" and "Vacoperm". The shielding plates 23 thereby prevent rotational effects between the mutually adjacent ones of the Wien filters (W1, W2, W3, W4). As required, also double marginal field diaphragms can be provided in order to achieve a higher shielding effect.

Additional electric insulators 24 and magnetic shielding plates 25 made of electrically conductive, soft magnetic material are provided on the two outer edges of the monochromator in order to insulate and/or shield the monochromator in total magnetically as well as electrically against the remaining components of the electron microscope into which the monochromator is to be built in.

Further electrical and magnetic shielding (26, 27) is provided between the two center Wien filters (W2, W3). An astigmatic intermediate image occurs in the center plane S3 of the Wien filter so that the slit diaphragm for the energy selection is to be mounted in this plane.

Notwithstanding their identical configurations in the section plane perpendicular to the optical axis, the four Wien filters (W1, W2, W3, W4) are operated partially rotated by 90° about the optical axis OA. If, in the first Wien filter W1, the pole shoes (13a, 15a) lying in the plane of the drawing of FIG. 2 form the magnetic dipoles and the pole shoes (16a, 14a) lying above and below the plane of the drawing form the electrostatic dipoles, then the drive of the second Wien filter W2, which follows the first Wien filter, is precisely rotated by 90°, that is, in the second Wien filter W2, the pole shoes, which lie in the plane of the drawing of FIG. 2, form the electrostatic dipoles and the pole shoes, which lie forward and rearward of the plane of the drawing of FIG. 2, form the magnetic dipoles. The Wien filter W3, which follows the center plane S3, is operated exactly inversely to the Wien filter W2 which is forward; that is, here too, the pole shoes which lie in the plane of the drawing of FIG. 2, form the electrodes of the electrostatic dipoles and the pole shoes, which lie forward and rearward of the plane of the drawing, form the magnetic dipoles but with an inverse polarity relative to the second Wien filter W2. The fourth Wien filter W4 is then operated, in turn, identically to the first Wien filter W1.

As shown above, the two center Wien filters (W2, W3) are anti-symmetric to each other and the two outer Wien filters (W1, W4) are symmetrical to each other and the two inner Wien filters (W2, W3) are rotated by 90° with respect to the optical axis OA relative to the neighboring external Wien filters (W1, W4).

Figure 3:
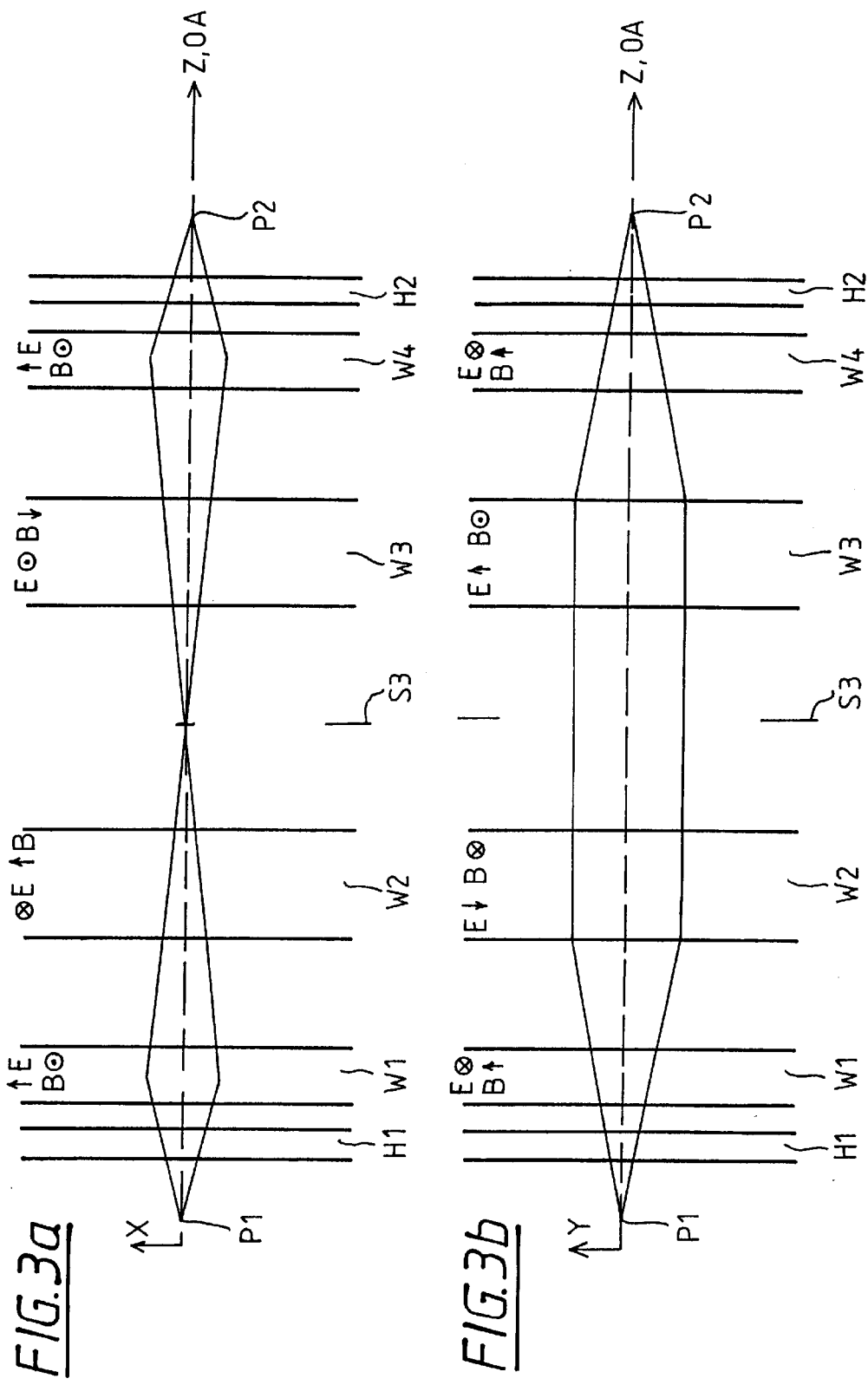
FIGS. 3a and 3b are schematic representations of the imaging characteristics of a monochromator in two mutually perpendicular cutting planes; and, FIG. 4 shows a diagram of the fundamental paths in a monochromator of FIGS. 1 and 2.

The imaging characteristics of the described Wien filter can be explained easily with respect to FIGS. 3a and 3b. In FIGS. 3a and 3b, the four Wien filters (W1, W2, W3, W4) are indicated with the directions of the respective electrical fields E and the respective magnetic fields B. In FIG. 3a, the fundamental paths are shown which proceed from a point P1 in a first section plane XZ. For the path traces in the XZ plane, only the two outer Wien filters (W1, W4) are focusing; whereas, in this section plane, the two center Wien filters (W2, W3) have no imaging or focusing characteristics because the magnetic fields B of the two center Wien filters (W2, W3) lie in the XZ plane and the electrostatic fields E of these two Wien filters (W2, W3) lie perpendicularly to the XZ plane. In contrast, only in the two outer Wien filters (W1, W4) does the Lorentz force and electrostatic force effect an imaging. The intensity of the fields in the two outer Wien filters (W1, W4) is so selected in dependence upon the electron energy that an astigmatic intermediate image occurs in the XZ plane in the center plane S3. Because of the symmetric configuration of the entire monochromator, the last Wien filter W4 images (symmetrical to the first Wien filter W1) the intermediate image, which arises in the center plane S3, into the point P2 lying rearward of the monochromator. The refractive power of the last Wien filter W4 is identical to the refractive power of the first Wien filter W1 and, for this reason, the first and last Wien filters (W1, W4) have identical lengths in the direction of the optical axis OA.

In FIG. 3b, the rays, which originate from the same point P1, are shown in a plane (in the YZ section) perpendicular to FIG. 3a. In this YZ section plane, the two outer Wien filters (W1, W4) are without focusing effect because the electrostatic fields E lie-perpendicular to this section plane and the magnetic fields B lie in this section plane. In contrast, in this section plane YZ, the two center Wien filters (W2, W3) effect an imaging because of the Lorentz force and because of the electrostatic force. The strength of the two center Wien filters (W2, W3) is so selected in dependence upon the particle energy that the particle paths, which originate from point P1, run after exiting from the second Wien filter W2, and therefore in the region of the center plane S3, parallel to the optical axis OA and are focused by the third Wien filter W3 into the same point P2 in which the imaging of the point P1 takes place in the XZ section. As already follows from the distances of the two center Wien filters (W2, W3) relative to the distances of the two outer Wien filters (W1, W4) to the two conjugated points (P1, P2), the refractive power of the two outer Wien filters (W1, W4) is selected greater than the refractive power of the two center Wien filters (W2, W3). The refractive powers of the two center Wien filters (W2, W3) are the same in magnitude. For this reason, the lengths of the two center Wien filters (W2, W3) in the direction of the optical axis are identical. They can, however, have a greater length than the two outer Wien filters (W1, W4) in the direction of the optical axis OA.

Overall, the monochromator as a unit images stigmatically, that is, the point P1 is imaged stigmatically in the point P2. The magnification in the XZ section is then +1 and in the YZ section −1. In the monochromator of the invention, this is achieved without additional quadrupole lenses or quadrupole field components of the individual Wien filter; that is, each of the Wien filters (W1, W2, W3, W4) defines a so-called homogeneous Wien filter.

Figure 4:
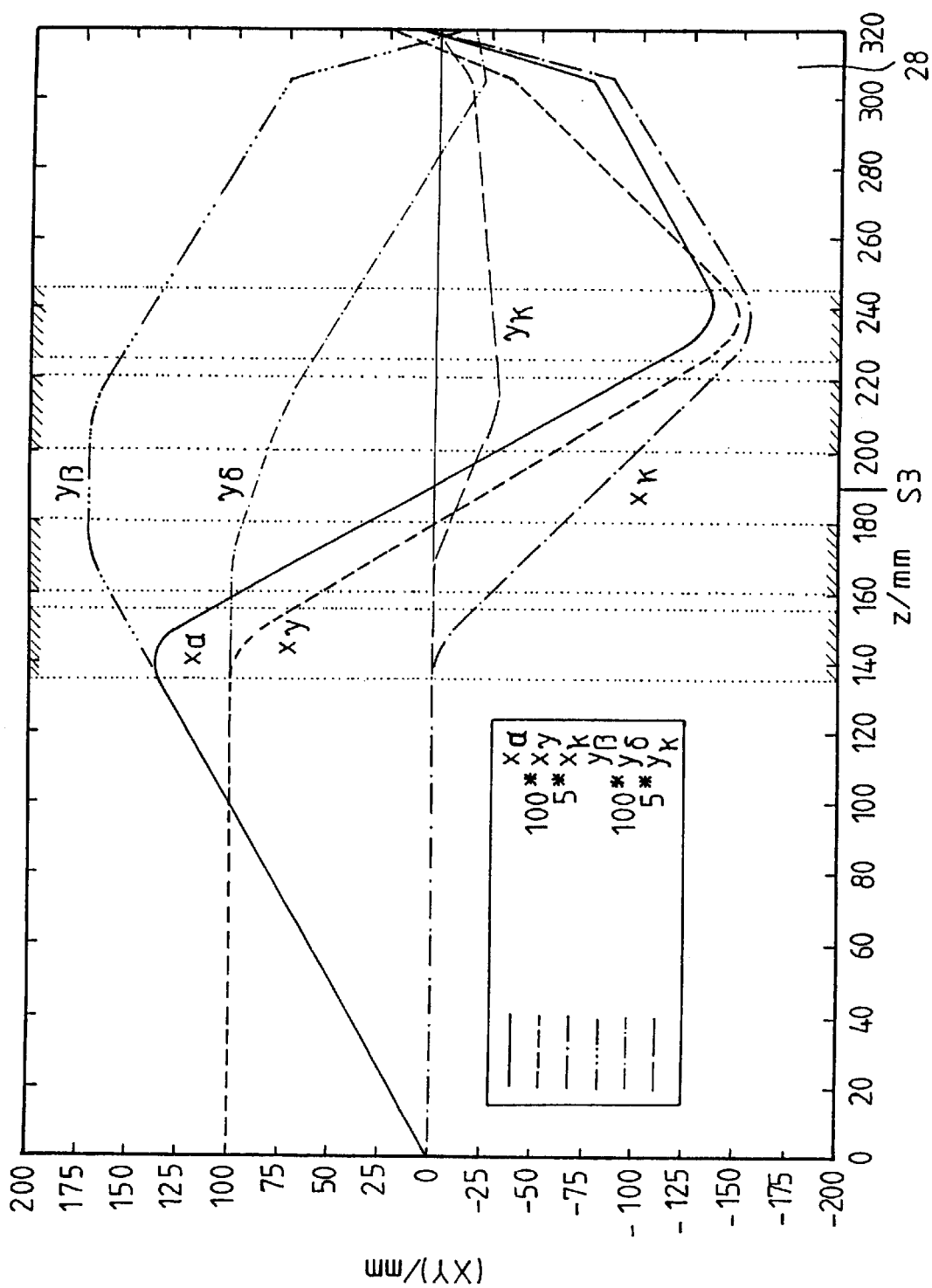

In FIG. 4, the following are shown: the fundamental paths ($x\alpha$, $y\beta$, $x\gamma$ and $y\delta$) as well as the dispersion path $x\kappa$ in the x-direction and $y\kappa$ in the y-direction for the monochromator described above. The fundamental paths are computed in the so-called SCOFF approximation (Sharp Cut-Off Fringing Field). For all four Wien filters (W1 to W4), the following dimensions form the basis: an effective field length of 20 mm and for the distances between the outer Wien filters and the mutually adjacent inner Wien filters, a spacing of 5 mm and for the spacing between the two center Wien filters (W2, W3), a spacing of 20 mm. As shown in FIG. 4, the fundamental path $x\alpha$ is anti-symmetric to the center plane S3 and the fundamental path $y\beta$ is symmetrical to the center plane S3.

Because of the correspondingly selected polarity of the individual Wien filters in such a manner that the polarity of the crossed fields in the first Wien filter W1 and in the fourth Wien filter W4 is identical and, in contrast, the polarity of the crossed fields in the two center Wien filters (W2 and W3) is opposite to each other, the monochromator as a whole is free of dispersion and is free of dispersion in both sections. In contrast, in the center plane S3, a usable dispersion is present in the x-direction ($x\kappa$), and, additionally, a non-usable dispersion is present in the y-direction ($y\kappa$). The usable dispersion ($x\kappa$) in the x-direction exceeds the non-usable dispersion in the y-direction ($y\kappa$) (see FIG. 4). The dispersion in the y-direction ($y\kappa$) is not usable because the energy selection slit has to be aligned parallel to the astigmatic intermediate image line because of the astigmatic intermediate image. Because of the dispersion path $y\kappa$ also in the y-direction, the line images, which arise in the center plane S3, are offset relative to each other depending upon the energy of the particle in the y-direction, that is, in the line direction. This, however, is not disturbing when the slit length of the slit diaphragm is selected sufficiently large or the line images for different energies lie offset in the slit direction in the slit diaphragm.

From the dispersion path (xκ) in the x-direction of 16.4 mm for a 10 keV electron, there results a dispersion of approximately 1.6 μm per eV in the center plane S3 which is relatively large for a 10 keV electron. A slit width of 320 nm is necessary in order to reduce the energy width to 0.2 eV. Slit widths of this kind are easily producible micromechanically. For electrons having an energy lower than 10 keV, the dispersion is correspondingly higher and correspondingly larger slit widths are sufficient to reach the same energy widths.

Because of the described symmetries or anti-symmetries of fields and axial fundamental paths, the monochromator is as a unit free of axial aberrations of the second order. The axial aberration of the second order in the x-direction in the energy selection plane, that is, in the center plane, can, as required, be corrected with the aid of second hexapoles or corresponding hexapole components of the Wien filters. Appropriate hexapoles (H1, H2) are indicated in FIGS. 3a and 3b. To maintain the symmetry of the entire system, these hexapoles likewise have to be arranged symmetrically to the center plane S3.

The fringing field diaphragms between the Wien filters (23, 27) in FIG. 2 are configured as pinhole diaphragms and are at ground or at a center value of the electrode potentials (beam potential) of the electrostatic dipoles of the two adjacent Wien filters. These fringing field diaphragms should be made of a material of high magnetic permeability and low remanence.

The four individual elements of the corrected monochromator according to the invention can be produced relatively easily. No quadrupole lenses or dispersive electron-optical prisms having quadrupole components are needed. The optical axis remains straight and the monochromator can therefore also be operated very simply in the switched-off state.

Only simple dipole fields (that is, without quadrupole component) are generated in the four Wien filters. For this reason, the adjustment of these four filters relative to each other and the adjustment of the entire monochromator to the lenses of the electron microscope is insensitive and is simple to effect.

With respect to FIG. 4, it is noted that for the simulation and computation of the fundamental beam paths it was assumed that the principal plane of the objective or condenser, which follows the monochromator, is mounted at the location identified by reference numeral 28. The refraction of the fundamental beam paths at this location does not take place via the monochromator but rather by the objective or condenser lens. Without the objective or condenser lens at the location identified by reference numeral 28, the fundamental beam paths would continue in a straight line from which the above-described symmetry characteristics and the dispersion freedom result. The dispersion freedom and also the advantages, which result from the symmetry characteristics, are retained even when using the objective lens or condenser lens.

It is understood that the foregoing description is that of the preferred embodiments of the invention and that various changes and modifications may be made thereto without departing from the spirit and scope of the invention as defined in the appended claims.

What is claimed is:

1. A monochromator for charged particles having a direction of propagation, the monochromator comprising:
   a plurality of Wien filters defining an optical axis and being arranged serially one behind the other in said direction of propagation; and,
   a first portion of said Wien filters being mounted azimuthally rotated about said optical axis by 90° relative to a second portion of said Wien filters.

2. The monochromator of claim 1, said plurality of Wien filters being at least four in number and said first portion of said Wien filters including two of said four filters and said two filters being azimuthally rotated by 90° relative to the two filters of said second portion.

3. The monochromator of claim 2, wherein two of said four Wien filters are outer Wien filters and the other two of said four Wien filters are inner Wien filters disposed between the two outer Wien filters; and, said inner Wien filters are excited antiparallel to each other.

4. The monochromator of claim 3, wherein said two inner Wien filters are spaced apart at a greater distance than each of said outer Wien filters is spaced from the next adjacent inner Wien filter.

5. The monochromator of claim 4, further comprising means for exciting said Wien filters so that they effect an astigmatic image in a center plane.

6. The monochromator of claim 4, wherein said outer Wien filters have a refractive power greater than the refractive power of said inner Wien filters; and, said Wien filters conjointly form an image stigmatically.

7. The monochromator of claim 4, further comprising a plurality of diaphragms and respective ones of said diaphragms being disposed between each two mutually adjacent ones of said Wien filters; and, each of said diaphragms being made of a magnetic, highly permeable and electrically conductive material.

8. A monochromator for charged particles having a direction of propagation, the monochromator comprising:
   at least one Wien filter defining an optical axis and being mounted in said direction of propagation; and,
   said Wien filter having a pair of pole shoes defining a magnetic dipole and a pair of electrodes defining an electric dipole; and, said pole shoes and said electrodes being configured symmetrically to each other with respect to an azimuthal rotation of 90°.

9. The monochromator of claim 8, wherein said pole shoes and said electrodes are made of a soft magnetic material.

10. The monochromator of claim 8, comprising:
    a plurality of Wien filters arranged serially one behind the other in said direction of propagation;
    a plurality of electrical insulators; and,
    respective ones of said plurality of said electrical insulators being disposed between each two mutually adjacent ones of said Wien filters.

11. The monochromator of claim 8, said pole shoes and said electrodes having respective surfaces directed toward each other and being configured as concentric spherical surface sections or coaxial cylindrical surface sections.

12. The monochromator of claim 10, wherein said plurality of Wien filters are four in number arranged coaxially to said optical axis; two of said four Wien filters are outer Wien filters and the other two of said four Wien filters are inner Wien filters disposed between the two outer Wien filters; and, the two inner Wien filters are orientated azimuthally rotated by 90° about said optical axis relative to said two outer Wien filters.

13. The monochromator of claim 8, further comprising magnetic coils for corresponding ones of said pole shoes and electric contacts for corresponding ones of said electrodes; and, said magnetic coils and said electric contacts being so provided that the field directions of the magnetic and electric dipoles are rotatable about said optical axis in 90° steps by selecting the drives of said magnetic coils and said electric contacts.

* * * * *

UNITED STATES PATENT AND TRADEMARK OFFICE
CERTIFICATE OF CORRECTION

PATENT NO. : 6,580,073 B2
DATED : June 17, 2003
INVENTOR(S) : Erich Plies, Jan Baertle and Armin Huber It is certified that error appears in the above-identified patent and that said Letters Patent is hereby corrected as shown below:

<u>Title page,</u>
Item [73], Assignee, delete "Elektronenmikros Kopie" and substitute
-- Elektronenmikroskopie -- therefor.

<u>Column 1,</u>
Between lines 48 and 49, please insert: -- Furthermore, electrostatic monochromators have already been suggested having curved optical axes. However,
systems having curved optical axes are, as a rule, difficult to adjust. --

<u>Column 6,</u>
Line 3, delete "lie-perpendicular" and substitute -- lie perpendicular --
therefor.

<u>Column 7,</u>
Between lines 14 and 15, please insert:
-- Because of the astigmatic intermediate image and no further real intermediate images in the monochromator, no relevant Boersch effect can be expected in the monochromator.
 The monochromator can also be so driven that subject point P1 and the image point P2, which is conjugated thereto, lie virtually and stigmatically in the monochromator. --

Signed and Sealed this

Twenty-seventh Day of January, 2004

JON W. DUDAS
*Acting Director of the United States Patent and Trademark Office*